(12) United States Patent
Kirsch et al.

(10) Patent No.: US 8,215,008 B2
(45) Date of Patent: Jul. 10, 2012

(54) METHOD FOR PRODUCING A HOUSING PART FOR A SEMICONDUCTOR MODULE

(75) Inventors: Olaf Kirsch, Erwitte (DE); Thilo Stolze, Arnsberg (DE)

(73) Assignee: Infineon Technologies AG, Neubiberg (DE)

( * ) Notice: Subject to any disclaimer, the term of this patent is extended or adjusted under 35 U.S.C. 154(b) by 62 days.

(21) Appl. No.: 13/006,588

(22) Filed: Jan. 14, 2011

(65) Prior Publication Data

US 2011/0173804 A1 Jul. 21, 2011

(51) Int. Cl.
*H05K 3/30* (2006.01)
(52) U.S. Cl. ............... 29/832; 29/825; 29/840
(58) Field of Classification Search ............. 29/825, 29/832, 840; 257/678
See application file for complete search history.

(56) References Cited

U.S. PATENT DOCUMENTS

| 4,727,457 | A | * | 2/1988 | Thillays | 362/582 |
| 6,376,902 | B1 | * | 4/2002 | Arndt | 257/678 |
| 6,469,321 | B2 | * | 10/2002 | Arndt | 257/82 |
| 6,573,580 | B2 | * | 6/2003 | Arndt | 257/433 |
| 6,759,733 | B2 | * | 7/2004 | Arndt | 257/672 |
| 7,427,806 | B2 | * | 9/2008 | Arndt et al. | 257/682 |

FOREIGN PATENT DOCUMENTS

| DE | 10217099 A1 | 11/2003 |
| EP | 0793407 A2 | 9/1997 |

* cited by examiner

*Primary Examiner* — Carl Arbes
(74) *Attorney, Agent, or Firm* — Murphy, Bilak & Homiller, PLLC

(57) ABSTRACT

A method for producing a housing part for a power semiconductor module includes providing a connecting lug having a lower end with a foot region, providing a housing having a side wall with a lead-in bevel, and inserting the connecting lug into the lead-in bevel so that the foot region projects inward into an interior of the housing. The method further includes encapsulating at least a portion of the foot region of the connecting lug inserted into the lead-in bevel with a first plastic to produce a positively locking first connection between the connecting lug and the side wall.

20 Claims, 6 Drawing Sheets

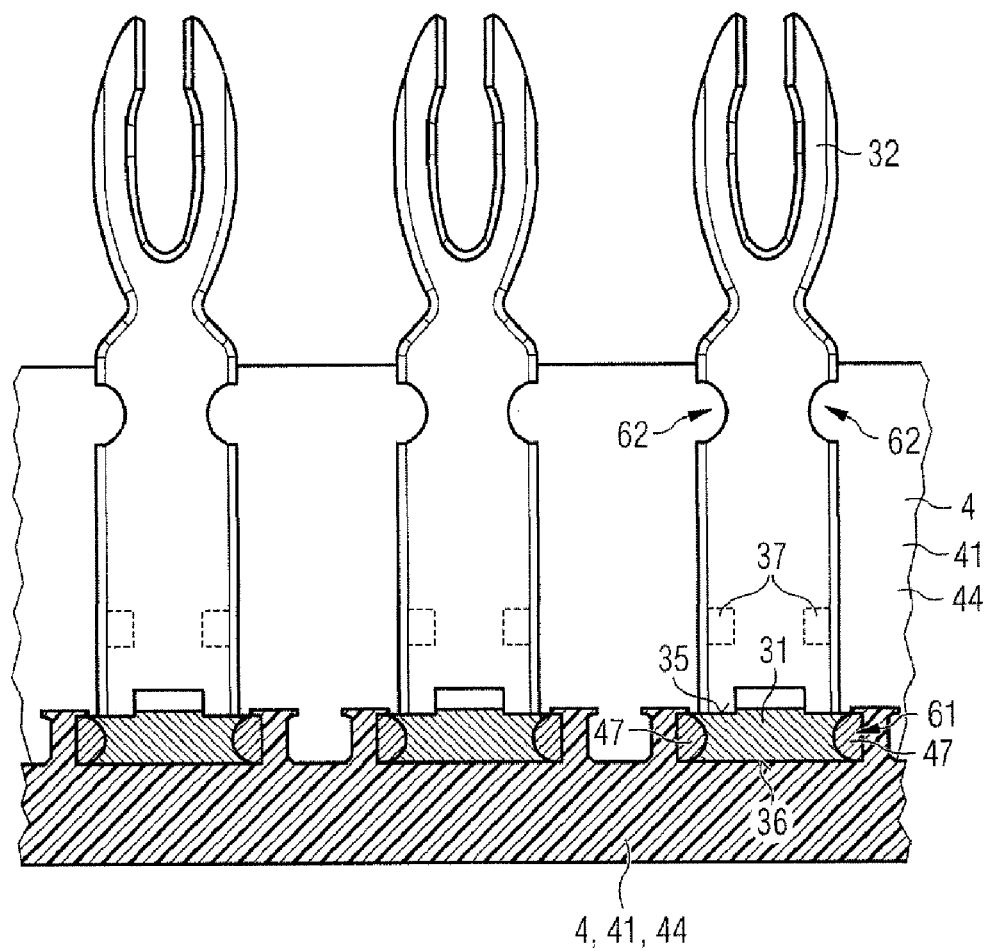

METHOD FOR PRODUCING A HOUSING PART FOR A SEMICONDUCTOR MODULE

PRIORITY CLAIM

This application claims priority to German patent application 10 2010 000 942.3 filed on 15 Jan. 2010, the content of said application incorporated herein by reference in its entirety.

FIELD OF TECHNOLOGY

The invention resides in the field of power semiconductor modules.

BACKGROUND

Power semiconductor modules have electrical connecting contacts for the electrical connection of module-external components, the contacts being accessible from the exterior of the module and being electrically conductively connected to one or more power semiconductor chips or other components arranged in the interior of the module. In this case, the electrical connection is at least partly realized by low-resistance electrical conductors, referred to hereinafter as connecting lugs. Such connecting lugs have to be connected to the housing in a sufficiently stable manner in order to prevent a module-external mechanical loading of the connecting contacts from being transmitted to other, module-internal components via the connecting lugs in an impermissible manner.

In order to avoid this problem, the connecting lugs in principle can be provided for a specific module layout and encapsulated by injection molding during the production of a plastic injection-molded housing for the power semiconductor module. However, this has the disadvantage that a dedicated injection mold is required in each case for different module layouts.

In order to electrically connect a connecting lug internal to the module, bonding connections can be used or also soldering, welding or electrically conductive adhesive connections. Switching currents for such modules tend to increase as a result of technical advancements. As such, bonding wires composed of copper or a copper alloy are increasingly being used instead of customary aluminum bonding wires. In comparison with aluminum bonding wires, however, copper-based bonding wires are significantly harder, for which reason the press-on force exerted on the bonding wire during the bonding process has to be significantly higher in the case of a copper-based bonding wire than in the case of an aluminum bonding wire. However, this has the effect that more stringent requirements have to be made of the mechanical connection between a connecting lug and a housing element of a power semiconductor module since the press-on force loads the mechanical connection between the connecting lug and the housing element.

Also of concern is the accuracy of the positioning of the connecting lugs. This is important firstly for module-internal electrical connections, for example if bonding wires are intended to be bonded to the connecting lugs in the interior of the power semiconductor module. Secondly, in the case of modules having a housing cover, it may be necessary to place the housing cover onto the connecting lugs in an accurately fitting manner. Moreover, the module-external connecting contacts of the connecting lugs have to be electrically connected to other components. Depending on the configuration of the other components, this may require a precise alignment of the connecting contacts and hence of the connecting lugs.

As such, the connecting lugs are conventionally realigned after the mounting process in a separate step which increases cost and reduces yield.

SUMMARY

According to an embodiment of a method for producing a housing part for a power semiconductor module, the method includes providing a connecting lug having a lower end with a foot region, providing a housing having a side wall with a lead-in bevel, and inserting the connecting lug into the lead-in bevel so that the foot region projects inward toward an interior of the housing. The method further includes encapsulating at least a portion of the foot region of the connecting lug inserted into the lead-in bevel with a first plastic to produce a positively locking first connection between the connecting lug and the side wall.

According to an embodiment of a method for producing a power semiconductor module, the method includes providing a connecting lug having a lower end with a foot region, providing a housing having a side wall with a lead-in bevel, and inserting the connecting lug into the lead-in bevel so that the foot region projects inward toward an interior of the housing. The method further includes encapsulating at least a portion of the foot region of the connecting lug inserted into the lead-in bevel with a first plastic to produce a positively locking first connection between the connecting lug and the side wall and bonding a bonding wire to a top side of the foot region.

Those skilled in the art will recognize additional features and advantages upon reading the following detailed description, and upon viewing the accompanying drawings.

BRIEF DESCRIPTION OF THE DRAWINGS

The invention can be better understood with reference to the following drawings and description. The components in the figures are not necessarily to scale, instead emphasis being placed upon illustrating the principles of the invention. Moreover, in the figures, like reference numerals designate corresponding parts. In the drawings:

FIG. 8 shows a vertical section through foot regions of a plurality of connecting lugs inserted into a housing side wall;

DETAILED DESCRIPTION

The detailed description below refers to the accompanying drawings, which form part of the description and which, on the basis of concrete configurations, elucidate the manner in which the invention can be realized. Directional indications in this regard such as e.g., "at the top", "at the bottom", "at the front", "at the back", "front", "rear", etc., are used with respect to the orientation of the figures explained. Since the elements in the configurations can be arranged in a large number of different orientations, the direction-linked terminology serves merely for clear elucidation and should in no way be understood as restrictive. The present invention can also encompass other configurations. Furthermore, the features of the different exemplary configurations described below can be combined with one another unless expressly mentioned to the contrary, or unless the combination of specific features is impossible for technical reasons.

Figure 1:
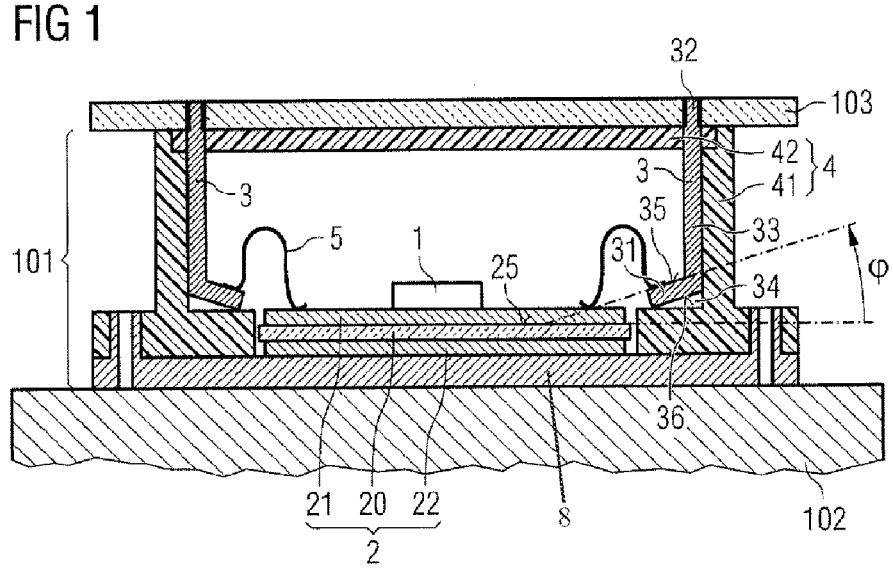
FIG. 1 shows a vertical section through an arrangement including a power semiconductor module having a metallic base plate and which is mounted on a heat sink and electrically connected by a module-external connecting conductor.

FIG. 1 shows a vertical section through a power semiconductor module 101, which is placed onto a heat sink 102 and connected by an electrical connecting conductor 103. The power semiconductor module 101 has a housing 4, which includes a side wall 41 and an optional cover 42. The housing side wall 41 can be embodied, for example, as a complete side wall or as part of a side wall, or as a housing frame closed in a ring-shaped fashion.

Furthermore, at least one circuit carrier 2 is provided, including a dielectric insulation carrier 20 with an upper metallization 21 structured to form conductor tracks, and a lower metallization 22. One or more power semiconductor chips 1 are arranged on the upper metallization 21.

The metallizations 21 and 22 are fixedly connected to the top side 25 and to the underside, respectively, of the insulation carrier 20. The insulation carrier 20 can be a ceramic, for example. Examples of suitable ceramic materials for this include aluminum nitride (AlN), aluminum oxide (Al2O3) silicon nitride (Si3N4), silicon carbide (SiC), or beryllium oxide (BeO). The metallizations 21 and 22 can be made from copper or a copper alloy having a high proportion of copper. The circuit carrier 2 can be, for example, a DCB substrate (DCB=Direct Copper Bonding) or an AMB substrate (AMB=Active Metal Brazing).

Connecting lugs 3 are inserted into the housing side wall 41. The connecting lugs have a lower end with a foot region 31 and an upper end with a connecting contact 32. At the connecting contact 32, each connecting lug 3 is accessible from the exterior of the power semiconductor module 101 and can thus be connected e.g., to a connecting conductor 103 or some other component external to the module 101. In the present example, the connecting contacts 32 are embodied as press-fit contacts that are press-fitted into openings of the connecting conductor 103. The connections formed in this case can be e.g., gastight connections (so-called "press-fit connections"). In principle, however, any other connection technique can be used. Thus, a connecting contact 32 can, for example, also be embodied as a soldering pin, a contact spring, a screw-on opening, a screw-on shoe, etc.

In the interior of the module housing 4, one or a plurality of bonding wires 5 are bonded onto a top side 35 of the foot region 31 of the respective connecting lugs 3. By the bonding wires 5, the connecting lugs 3 are electrically conductively connected to the circuit carrier 2 equipped with the power semiconductor chip 1. Such a bonding wire 5 can be bonded, for example, as shown in FIG. 1, directly onto the upper metallization 21 of the circuit carrier 2, onto an upper metallization of a power semiconductor chip 1, or onto any other component of the power semiconductor module 101.

The bonding wires 5 can be copper-based bonding wires made completely or at least predominantly, i.e., to the extent of more than 50% by weight, of copper. They can have very high diameters of e.g., at least 400 µm or at least 500 µm. However, smaller diameters are likewise possible. Moreover, instead of or in addition to copper-based bonding wires, bonding wires 5 composed of any other materials, e.g., composed of aluminum or aluminum alloys can be used.

As the bonding wire diameter increases, the press-on force needed for bonding of a bonding wire 5 increases. This is also accompanied by an increase in the loading—having an effect during the bonding process—on the connection between the connecting lug 3 onto which bonding is effected and the housing side wall 41 to which the connecting lug 3 is connected.

Furthermore, the entire connecting lug 3 or at least the foot region 31 of the connecting lug 3 can be made of copper, or from a copper alloy predominantly of copper. This ensures that the material of the foot region 31 is not too soft in relation to the material of the bonding wire 5, independently of whether the bonding wire 5 used is made wholly or at least predominantly of copper of aluminum.

The foot region 31 of a connecting lug 3 can comprise, on its top side 35, a planar section inclined by a predefined angle φ with respect to the substantially planar top side 25 of the insulation carrier 20. The angle φ can be chosen to be, for example, greater than or equal to 0° and less than 10°, greater than 0° and less than 10°, or greater than or equal to 1° and less than 10°. If the angle φ is in this case greater than 0°, the underside 36 of the foot region 31, on its side facing the module interior, bears on a pedestal of the side wall 41 and is thereby mechanically stabilized during the bonding process in which a bonding wire 5 is bonded onto the top side 35, as a result of which the quality of the bonding connection increases.

An optional free space 34 may be present below the foot region 31 in that neither material of the housing 4 nor material of the connecting lug 3 is situated in the free space 34. During the production of the module 101, the free space 34 can be filled for example with gas of the surrounding atmosphere. Optionally, however, after the production of the bonding connection between the bonding wire 5 and the connecting lug 3, the interior of the housing 4 can be filled with a potting compound which also wholly or partly fills the free spaces 34. Such a potting compound can be, for example, a soft potting compound composed of a silicone gel. However, the production of the bonding connection between the bonding wire 5 is effected before the connection of the connecting conductors 103 and before the mounting of the optional housing cover 42, if such a cover is provided.

In the case of the power semiconductor module 101 shown in FIG. 1, the circuit carrier 2 is arranged on a metallic base plate 8, which additionally carries the housing 4, and via which the heat arising in the module 101, e.g., the heat arising in the power semiconductor chips 1, is dissipated toward the heat sink 102.

Figure 2:
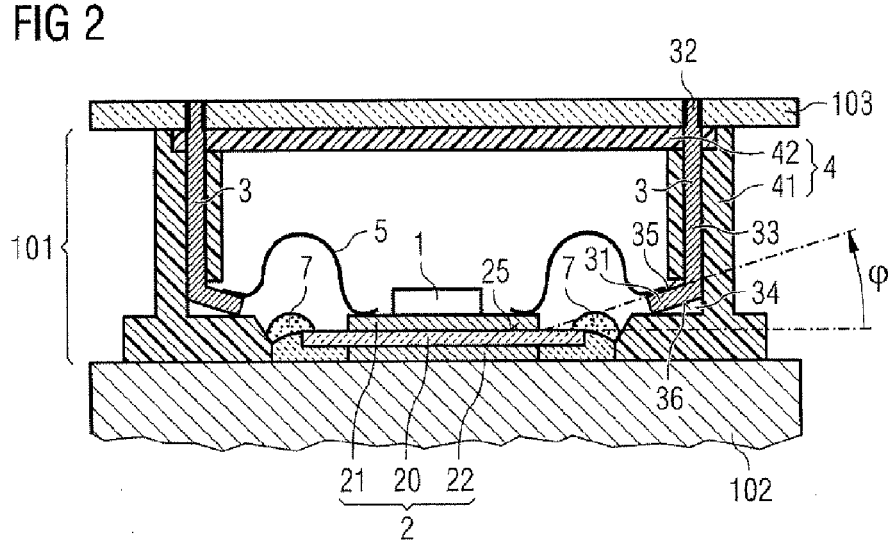
FIG. 2 shows a vertical section through a base plate-free power semiconductor module.

In accordance with an alternative configuration of a power semiconductor module 101 as shown in FIG. 2, however, such a metallic base plate 8 is dispensed with. In the case of a configuration of this type, if appropriate, a plurality of circuit carriers 2 are elastically connected to the housing 4 via elastic adhesive connections 7 such as a silicone adhesive, for example.

Figure 3:
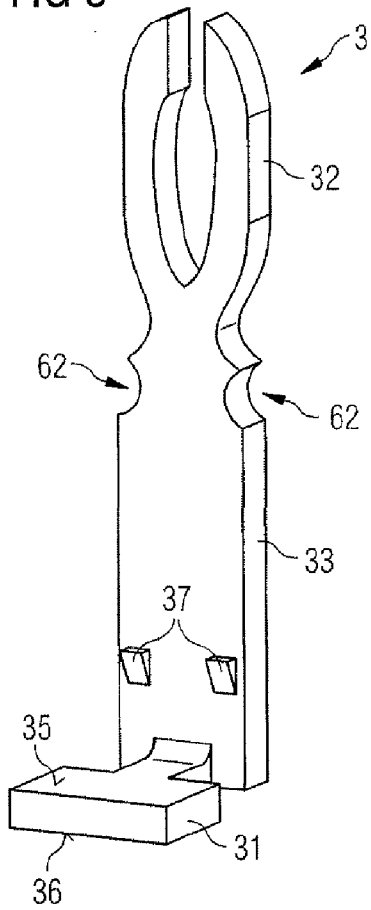
FIG. 3 shows a perspective view of a connecting lug such as can be used in the power semiconductor modules in accordance with FIGS. 1 and 2.

FIG. 3 shows a perspective view of a connecting lug 3 such as can be used, for example, in the case of a power semiconductor module 101 explained with reference to FIGS. 1 and 2. The connecting lug 3 has a foot region 31 with a top side 35 and an underside 36. At its upper end, the connecting lug 3 is provided with a connecting contact 32, which is embodied by way of example as a press-fit contact. Such a press-fit contact can, for example, be press-fitted into an opening of a connecting conductor 103, as is shown in FIGS. 1 and 2, and thereby be electrically conductively connected to the external connecting conductor 103.

The connecting lug 3 also has a shaft 33, on which one or a plurality of latching tabs 37 can be formed. The latching tabs can be produced by an embossing die, for example, which acts on the rear side of the shaft 33 that lies opposite the latching tabs 37, such that material protrusions that form the latching tabs 37 arise on the front side of the shaft 33.

Moreover, the connecting lug 3 can have, between the foot region 31 and the connecting contact 32, one or a plurality of optional cutouts 62 spaced apart from the foot region 31.

Figure 4:
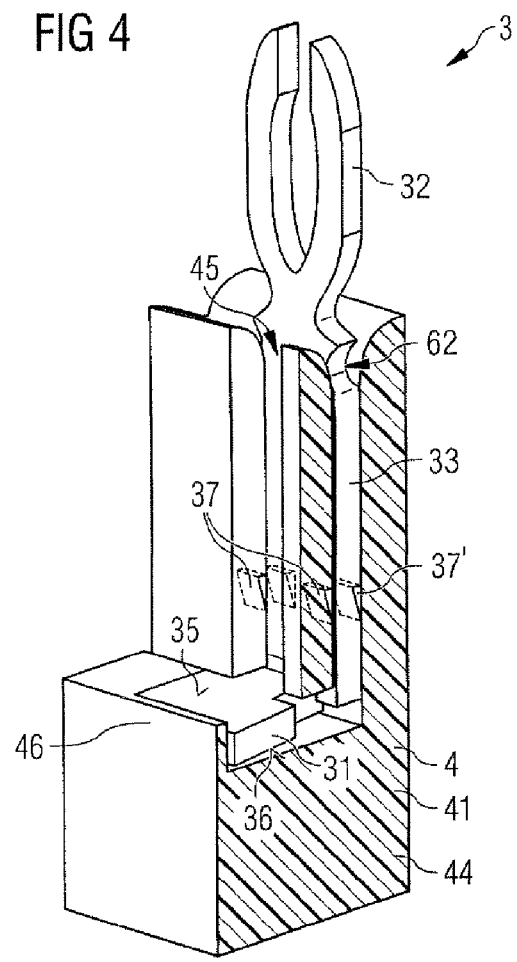
FIG. 4 shows a perspective sectional view of the connecting lug shown in FIG. 3 after insertion into a housing side wall of a power semiconductor module.

FIG. 4 shows a perspective view of a section of a housing side wall 41 into which a connecting lug 3 as shown in FIG. 3 is inserted. For this purpose, the housing side wall 41 has a lead-in bevel 45, into which the connecting lug 3 is inserted with its foot region 31 ahead and which is configured in such a way that the latching tabs 37 displace the plastic of the housing 4, such that the connecting lug 3 digs in during insertion into the lead-in bevel 45 with the housing 4. This sectional view also reveals a depression 37' on the rear side of the shaft 33, said depression remaining during the production of the latching tabs 37.

After the connecting lug 3 has been completely inserted into the lead-in bevel 45, the foot region 31 is partly encapsulated with a plastic by melting, such that the connecting lug 3 is connected to the housing 4 in a positively locking manner in the foot region 31. Moreover, in this case the shaft 33 can also be at least partly encapsulated by the melting of plastic.

The encapsulation by melting plastic can be effected in such a way that the plastic of the housing side wall 41 is locally melted by a heating die and the foot region 31 and optionally the shaft 33 are partly embedded into the molten plastic, such that a positively locking connection between the connecting lug 3 and the housing side wall 41 arises after the cooling and solidification of the molten plastic. The local melting of the plastic for the encapsulation of the foot region 31 can be effected in a region 46 of the housing side wall 41, for example.

Alternatively or additionally, the encapsulation can also be effected in such a way that a separately supplied, fusible plastic is supplied, into which the foot region 31 and optionally the shaft 33 are partly embedded into the molten plastic, such that a positively locking connection between the connecting lug 3 and the housing side wall 41 arises after the cooling and solidification of the molten plastic.

In this case, the degree of enclosure of the connecting lug 3 after the encapsulation by melting and cooling of the molten plastic can be chosen as desired so that only edge zones of the foot region 31 and/or of the shaft 33 are enclosed, and/or that cutouts in the foot region 31 and/or in the region of the shaft 33 are wholly or partly filled, through to the complete enveloping of the shaft 33. Preferably, a sufficient section on the top side 35 of the foot region 31 for producing the bonding connection remains free, i.e., is not covered by plastic.

Figure 5:
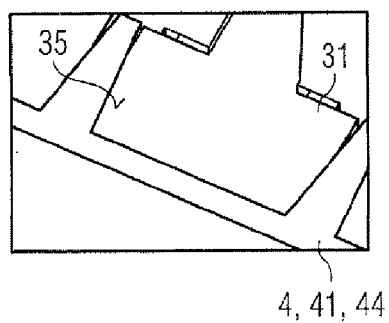
FIG. 5 shows a perspective view of a foot region of the connecting lug which is inserted into the housing side wall and locally encapsulated by plastic.

FIG. 5 shows an enlarged perspective view of the foot region 31 and of the top side 35 inclined relative to the top side of the insulation carrier 20.

Figure 6:
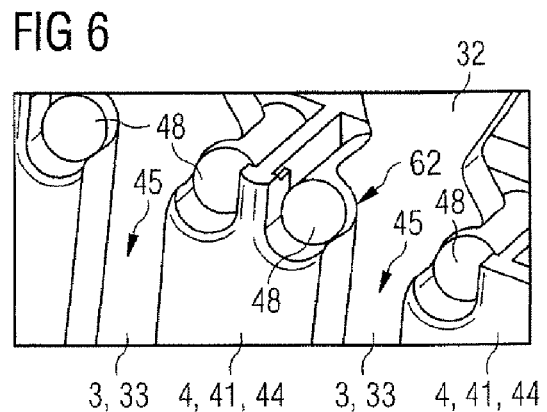
FIG. 6 shows a perspective view of a connecting lug in accordance with FIG. 3, with the connecting lug being connected to the housing side wall in a positively locking manner by encapsulation by in a shaft region situated between the foot region and the connecting contact.

FIG. 6 shows an enlarged perspective view of a housing side wall 41 having two lead-in bevels 45, into each of which a connecting lug 3, as explained with reference to the previous figures, is inserted and at least partly encapsulated by plastic in its foot region 31 and optionally also in the region of its shaft 33.

In the case of the arrangement in accordance with FIG. 6, the cutouts 62 shown in FIGS. 3 and 4 are additionally also encapsulated by plastic 48 by melting in the region of the shaft 33. The cutouts 62 can be encapsulated by melting in such a way that the plastic of the housing side wall 41 is locally melted by a heating die and introduced into the cutouts 62, such that a positively locking connection between the connecting lug 3 and the housing side wall 41 also arises in the region of the shaft 33 after cooling and solidification of the molten plastic.

However, the plastic 48 need not necessarily be a plastic of the housing side wall 41. Rather, additionally or alternatively, a separately supplied plastic can also be used for the process of encapsulation by melting.

Figure 7:
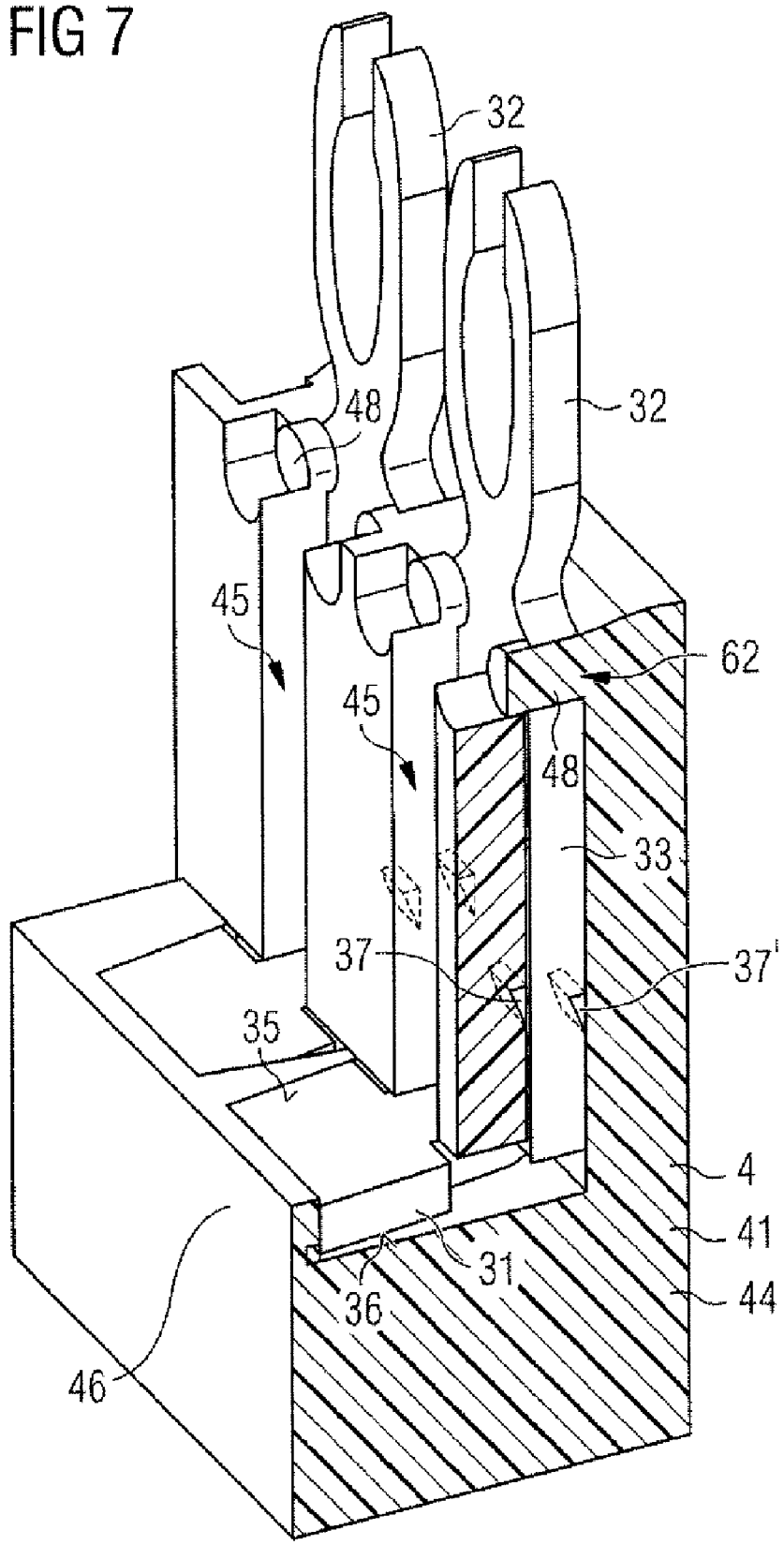
FIG. 7 shows a perspective sectional view through a housing part for a power semiconductor module in which the housing side wall has a plurality of lead-in bevels, into each of which a connecting lug is inserted and locally encapsulated by plastic.

FIG. 7 shows a perspective sectional view of a housing side wall 41 corresponding to the view in accordance with FIG. 4, with positively locking connections between the connecting lugs 3 and the housing side wall 41 produced in the region of the cutouts 62 of the connecting lugs 3, as was explained with reference to FIG. 6.

The above-explained possibility of inserting connecting lugs 3 into prepared lead-in bevels 45, after the production of the housing side wall 41 and connecting the connecting lugs 3 fixedly to the housing side wall 41 opens up the possibility of flexible population. This is because if the housing side wall 41 is equipped with a multiplicity of lead-in bevels 45 distributed in a suitable manner in the housing side wall 41, it is possible, depending on the respectively required layout of the power semiconductor module 101, for only particular ones of the lead-in bevels 45 to be populated with a respective connecting lug 3 in the manner explained above and thereby be adapted to the layout.

FIG. 8 shows an optional configuration, with connecting lugs 3 for mechanical stabilization, prior to encapsulation with the plastic of the housing side wall 41 by melting, are partly provided with a plastic 47 that differs from the plastic of the housing side wall 41. By way of example, the plastic 47 can be supplied externally by a feeder during the above-explained encapsulation of the connecting lug 3 with the plastic of the housing side wall 41 by melting. Alternatively or supplementary, in a separate process the plastic 47 can be fixedly and permanently connected to the relevant coating lug 3 and subsequently inserted into the respective lead-in bevels 45 e.g. as shown in FIGS. 4 and 7.

Examples of suitable techniques for connection between the plastic 47 and a connecting lug 3 include thermal lamination, in which the plastic 47 is pressed against the connecting lug 3 with the application of heat and pressure in a manner free of adhesive, or embossing. The embossing can be effected e.g., during the process of stamping out the connecting lug 3 from a stamping strip. During the subsequent process of encapsulation by melting, the plastic 47 is then fixedly connected to the plastic of the housing side wall 41 and/or to the separately supplied plastic.

The use of the second plastic 47 results in an adhesive connection between the second plastic 47 and the plastic of the housing side wall 41 and thus the connection between the housing side wall 41 and the connecting lug 3 is made more stable than without the use of the second plastic 47.

The use of the second plastic 47 prevents or at least minimizes adverse effects, for example the occurrence of micro cracks during the cooling of the plastic used for the encapsulation of the connecting lugs 3 by melting.

Figure 9A:
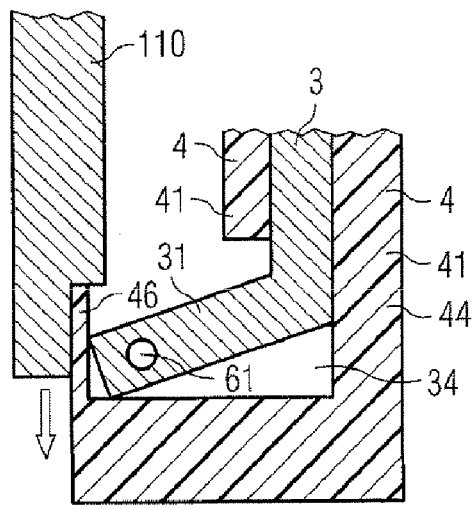
FIGS. 9A-9C show different steps in a process of a connecting lug being encapsulated by localized melting of the plastic of the housing side wall.
Figure 9B:
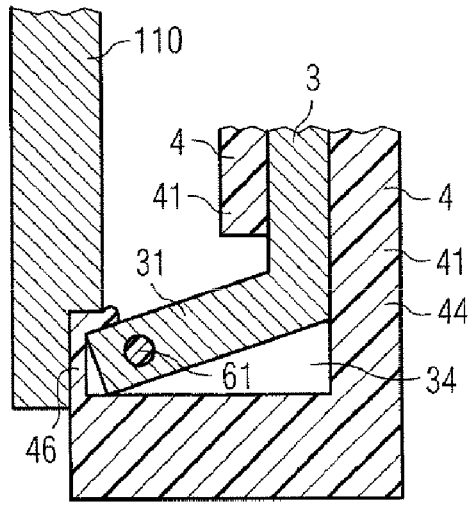
Figure 9C:
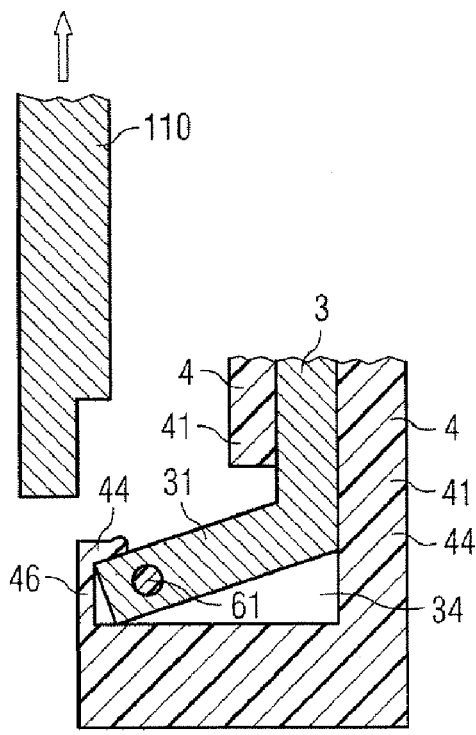

FIGS. 9A to 9C show different steps in the process of encapsulating the foot region 31 of a connecting lug 3 by melting of the plastic from a region 46 of a housing side wall 41. As is shown in FIG. 9A, a heated shaping die 110, the shape of which is adapted to the geometry of the region 46 to be melted of the housing side wall 41 and also to the shape of the foot region 31, is pressed onto the region 46 to be melted, such that the plastic of the housing side wall 41 melts locally in the region 46 and is deformed by the shaping die 110 being pressed on further and, in the process, is pressed against the foot region 31 in such a way that the foot region 31 is encapsulated by the locally melted plastic, which is shown in FIG. 9B. In this case, the plastic of the housing side wall 41 is locally heated by the shaping die 110 up to a temperature that is higher than the glass transition temperature and lower than the melting point of the plastic. In this temperature range, the plastic does not yet flow, but is sufficiently soft and can thereby be deformed by the shaping die 110.

As shown in the sectional view in accordance with FIG. 9A, the foot region 31 has a cutout 61, which is situated, merely by way of example, on a side area of the foot region 31. Plastic from the region 46 of the housing side wall 41 is locally melted by the shaping die 110 and introduced into the cutout 61, which is also shown in FIG. 9B.

After the removal of the shaping die 110, as illustrated in FIG. 9C, the molten plastic can cool and solidify, so that the connecting lug 3 is firmly fixed in the housing side wall 41 in the foot region 31.

Figure 10A:
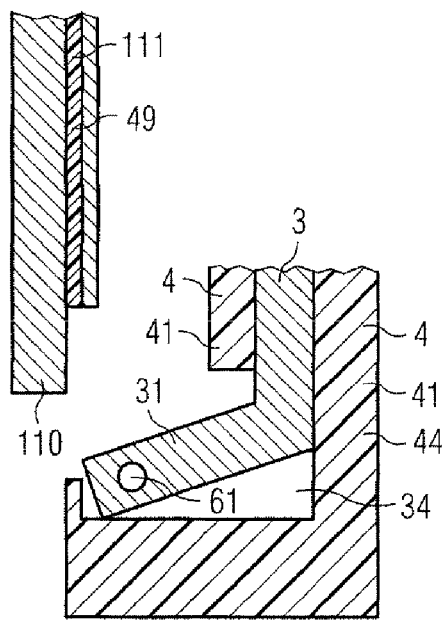
FIGS. 10A-10C show different steps in a process of a connecting lug being encapsulated by addition of separate plastic.
Figure 10B:
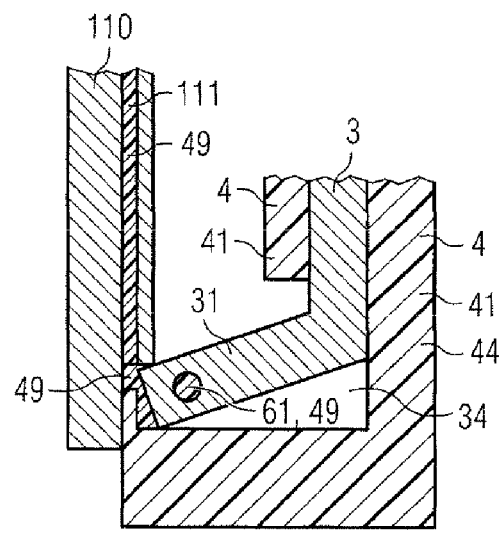
Figure 10C:
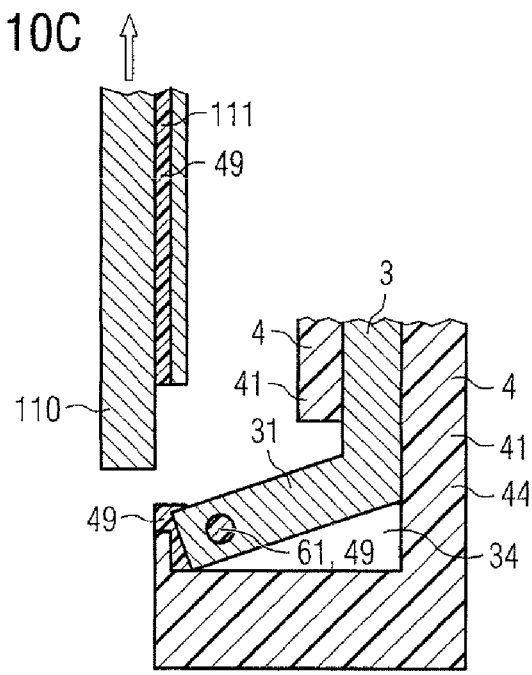

FIGS. 10A to 10C show different steps in a process of encapsulating the foot region 31 of a connecting lug 3 by melting a plastic different from the plastic of the housing side wall 41. As is shown in FIG. 10A, a heated shaping die 110, the shape of which is adapted to the geometry of the foot region 31, is brought to the foot region 31. The shaping die 110 has a channel 111, through which, as is shown in FIG. 10B, a molten plastic 49 is separately supplied to the foot region 31 and the optional cutout 61.

After the removal of the shaping die 110, as illustrated in FIG. 10C, the separately supplied plastic 49 can cool and solidify in the process, so that the connecting lug 3 is firmly fixed in the housing side wall 41 in the foot region 31. Moreover, the plastic of the housing side wall 41 can also be locally melted by the shaping die 110, so that the plastic of the housing side wall 41 bonds fixedly with the separately supplied plastic 49 after cooling. The separately supplied plastic 49 and the plastic of the housing side wall 41 can be identical or different plastics.

The encapsulation of the connecting lug 3 by melting as explained with reference to FIGS. 9A to 9C and 10A to 10C can be effected in a corresponding manner with a suitably adapted shaping die also during the encapsulation of the shaft 33 by melting for example in the region of the cutouts 62 shown in FIGS. 3, 4, 6, 7 and 8, such that the connecting lug 3, as explained with reference to FIGS. 6 and 7, are encapsulated by melting in the region of the cutouts by the plastic 48 and is thereby reliably fixed relative to the housing side wall 41.

The methods of the positively locking linking of a connecting lug 3 to a housing side wall 41 which have been explained in the examples above ensure that both the connecting contact 32 and the foot region 31 of the connecting lug 3 are situated in a sufficiently fixed manner exactly at the desired position of the housing side wall 41.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method for producing a housing part for a power semiconductor module comprising:
    providing a connecting lug having a lower end with a foot region;
    providing a housing having a side wall with a lead-in bevel;
    inserting the connecting lug into the lead-in bevel so that the foot region projects inward toward an interior of the housing; and
    encapsulating at least a portion of the foot region of the connecting lug inserted into the lead-in bevel with a first plastic to produce a positively locking first connection between the connecting lug and the side wall.

2. The method as claimed in claim 1, wherein the first plastic is formed by melting a region of the side wall.

3. The method as claimed in claim 1, wherein the first plastic is formed by providing a plastic separate from a plastic of the side wall and melting the separate plastic adjacent the foot region.

4. The method as claimed in claim 1, wherein the foot region has a first cutout at least partly filled with the first plastic.

5. The method as claimed in claim 1, wherein the connecting lug has an upper end at which a connecting contact is disposed, the method further comprising encapsulating the connecting lug inserted into the lead-in bevel with a second plastic at least in a section between the first connection and the connecting contact to produce a positively locking second connection between the connecting lug and the side wall.

6. The method as claimed in claim 5, wherein the second plastic is formed by melting a region of the side wall.

7. The method as claimed in claim 5, wherein the second plastic is formed by providing a plastic separate from a plastic of the side wall and melting the separate plastic.

8. The method as claimed in claim 5, wherein the connecting lug has a cutout between the foot region and the connecting contact which is at least partly filled with the second plastic.

9. The method as claimed in claim 1, wherein the connecting lug has at least one latching tab which displaces a plastic of the side wall and digs into the side wall during insertion of the connecting lug into the lead-in bevel.

10. The method as claimed in claim 5, further comprising applying a third plastic to the connecting lug before the connecting lug is inserted into the lead-in bevel.

11. The method as claimed in claim 10, wherein the third plastic is introduced into a cutout formed in the foot region.

12. The method as claimed in claim 10, wherein the first plastic is a different plastic than the third plastic.

13. A method for producing a power semiconductor module comprising:
   providing a connecting lug having a lower end with a foot region;
   providing a housing having a side wall with a lead-in bevel;
   inserting the connecting lug into the lead-in bevel so that the foot region projects inward toward an interior of the housing;
   encapsulating at least a portion of the foot region of the connecting lug inserted into the lead-in bevel with a first plastic to produce a positively locking first connection between the connecting lug and the side wall; and
   bonding a bonding wire to a top side of the foot region.

14. The method as claimed in claim 13, wherein the foot region has an underside formed by a side of the foot region opposite the top side, the method further comprising forming a free space between the underside of the foot region and the side wall after the connecting lug is completely inserted into the lead-in bevel and before the bonding wire is bonded to the top side of the foot region.

15. The method as claimed in claim 13, wherein the bonding wire has a diameter of at least 500 μm.

16. The method as claimed in claim 13, wherein the bonding wire comprises more than 50% by weight copper.

17. The method as claimed in claim 13, further comprising connecting a circuit carrier equipped with a power semiconductor chip to the side wall, the circuit carrier having a flat insulating substrate with a planar top side, the top side of the foot region having a planar section inclined relative to the top side of the insulating substrate.

18. The method as claimed in claim 17, wherein the planar section of the top side of the foot region forms an angle ($\phi$) of greater than or equal to 0° and of less than 10° with the top side of the insulating substrate.

19. The method as claimed in claim 18, wherein the angle ($\phi$) is greater than 0° and less than 10°.

20. The method as claimed in claim 18, wherein the angle ($\phi$) is greater than or equal to 1° and less than 10°.

\* \* \* \* \*